(12) United States Patent
McKinnon et al.

(10) Patent No.: US 7,135,864 B1
(45) Date of Patent: Nov. 14, 2006

(54) SYSTEM AND METHOD OF ELLIPTICALLY DRIVING AN MRI COIL

(75) Inventors: Graeme C. McKinnon, Hartland, WI (US); Daniel J. Weyers, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/161,037

(22) Filed: Jul. 20, 2005

(51) Int. Cl.
*G01V 3/00* (2006.01)

(52) U.S. Cl. ...................................... 324/318; 324/322
(58) Field of Classification Search ................ 324/318, 324/322, 319, 309, 307, 300; 600/410–422
See application file for complete search history.

(56) References Cited

U.S. PATENT DOCUMENTS

| | | | |
|---|---|---|---|
| 5,235,279 A * | 8/1993 | Kaufman et al. ............ | 324/309 |
| 5,372,137 A * | 12/1994 | Wong et al. ................ | 600/422 |
| 6,043,658 A * | 3/2000 | Leussler ..................... | 324/318 |
| 6,150,816 A * | 11/2000 | Srinivasan .................. | 324/318 |
| 6,169,401 B1 * | 1/2001 | Fujita et al. ................ | 324/318 |
| 6,501,274 B1 * | 12/2002 | Ledden ....................... | 324/318 |
| 6,535,084 B1 * | 3/2003 | Tropp .......................... | 333/219 |
| 6,952,100 B1 * | 10/2005 | McKinnon et al. ......... | 324/318 |
| 2004/0140808 A1 * | 7/2004 | Vaughan, Jr. ............... | 324/318 |

OTHER PUBLICATIONS

Hoult et al., "Quadrature Detection in the Laboratory Frame," MRM, 1:339-353 (1984).
Glover et al., "Comparison of Linear and Circular Polarization for Magnetic Resonance Imaging," JMR, 64:255-270 (1985).
Roschmann, "Radiofrequency penetration and absorption in the human body; Limitations to high-field whole-body nuclear magnetic resonance imaging," Med. Phys., 14:922-931 (1997).
Li et al., "A method to Create an Optimum Current Distribution Distribution and Homogenous $B_1$ Field for Elliptical Birdcage Coils," MRM, 37:600-608 (1997).

* cited by examiner

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

An RF coil apparatus for generating an elliptical polarization field includes an RF coil assembly having a pair of independent drive channels connected thereto. The drive channels are driven such that an elliptical polarization field is generated in a volume-of-interest within the RF coil assembly. The elliptical polarization field is generated about a subject having a generally elliptical cross-section disposed within the volume-of-interest.

24 Claims, 3 Drawing Sheets

SYSTEM AND METHOD OF ELLIPTICALLY DRIVING AN MRI COIL

BACKGROUND OF THE INVENTION

The present invention relates generally to magnetic resonance (MR) imaging and, more particularly, to a system and method of driving a birdcage coil to generate an elliptically-shaped $B_1$ field.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is generally desirable to have a relatively uniform sensitivity, both for signal generation and reception, throughout a cross-section of an imaged object when acquiring MR data. However, as the resonance frequency is increased, this becomes more difficult due to conductive losses and wavelength effects within the object. Further, as frequency increases, the power deposition required to achieve a given $B_1$ field also increases.

Quadrature excitation and reception has been adapted as a standard method of operating volume RF coils to achieve a relatively uniform sensitivity or $B_1$ field. Compared with a linear mode of operation, quadrature excitation and reception may result in signal-to-noise ratio (SNR) improvements of up to 40% and a power reduction of up to a factor of 2.0 for the same effective $B_1$ field.

It is well known that in free space, a quadrature operated volume birdcage coil produces and receives a circularly polarized $B_1$ field. For lossy objects with a relative permittivity similar to water and circular in cross-section, the $B_1$ field is only truly circularly polarized over a small region at the center. Nevertheless, for a circular cross-sectioned object, a circularly polarized $B_1$ field is considered the most efficient in terms of $B_1$ field generated for a given amount of power.

For elliptically-shaped objects, however, circular polarization is less than optimal. That is, if a subject has an elliptical cross-section, then a circularly polarized $B_1$ field is not well-matched to the subject and, therefore, is less than optimal. Similarly, the SNR on reception is less than optimal. Further, transmit efficiency, which is defined as $B_1$ field strength divided by the square root of the power deposited in the subject, is relatively poor. This is particularly problematic in abdominal imaging and similar scans where the object under inspection is defined to have an elliptical cross-section.

It would therefore be desirable to have a system and method capable of generating a polarized $B_1$ field better suited for an elliptically cross-sectioned subject.

BRIEF DESCRIPTION OF THE INVENTION

The present invention provides a system and method of generating an elliptically polarized $B_1$ field that overcomes the aforementioned drawbacks. An RF coil assembly includes a pair of independent drive channels. An RF coil assembly controller controls input to the pair of independent drive channels to create an elliptically polarized $B_1$ field for a subject having an elliptical cross-section within a volume-of-interest.

In accordance with one aspect of the invention, an RF apparatus includes an RF coil assembly having a circular coil arrangement and having a pair of independent drive channels connected to the circular coil arrangement. The RF coil assembly is designed to generate a polarized $B_1$ field about a volume-of-interest. An RF coil assembly controller is included that is operationally connected to control input to the pair of independent drive channels to create a substantially elliptical polarized $B_1$ field about a subject having a generally elliptical cross-section disposed within the volume-of-interest.

In accordance with another aspect of the invention, a method of exciting a volume-of-interest for MR imaging includes positioning an object having an elliptical cross-section in a bore of a magnet. The method also includes determining an alignment of a major axis of the elliptical cross-section and creating an elliptical $B_1$ field in the bore relative to the major axis with a circular RF coil arrangement.

In accordance with yet another aspect of the invention, an MR imaging apparatus includes a birdcage coil designed to generate a substantially elliptical $B_1$ field about a volume-of-interest. The apparatus also includes a controller to drive the birdcage coil to generate the substantially elliptical $B_1$ field about the volume-of-interest on demand.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
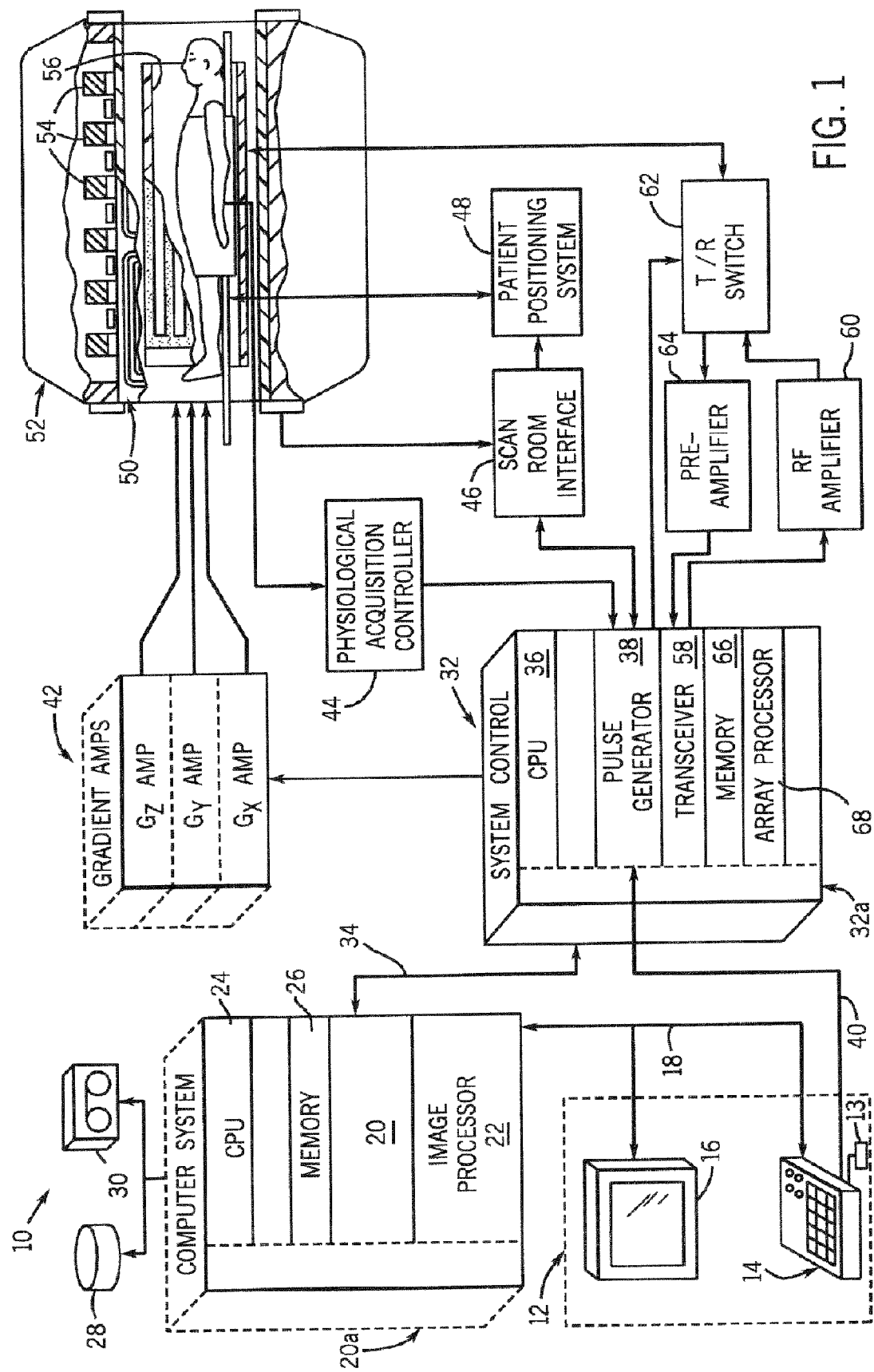
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to an MR imaging technique of tailoring an excitation field to fit the contours of a subject using the MR system illustrated in FIG. 1, or equivalents thereof. Specifically, the invention will be described with respect to generating an elliptical $B_1$ field; however, one skilled in the art will appreciate that $B_1$ fields of other shapes are contemplated.

An ellipse is defined as the locus of points for which the sum of the distances from each point to two fixed points is equal. An ellipse has a major axis passing through the two fixed points that is the longest segment that passes through the ellipse. A minor axis orthogonally bisects the major axis and is the shortest segment that passes through the ellipse. A circle is defined as a locus of points for which the distance from each point to a single fixed point is equal. While a circle may be characterized by the definition of an ellipse where the two fixed points are identical, as used herein, an ellipse does not refer to a circle. Rather, an ellipse as used herein refers to a shape defined by the definition of an ellipse having two separate, fixed points. For an imaging object having a substantially elliptical cross-section, a generally elliptical $B_1$ polarization field improves transmit efficiency over a circular $B_1$ polarization field.

Figure 2:
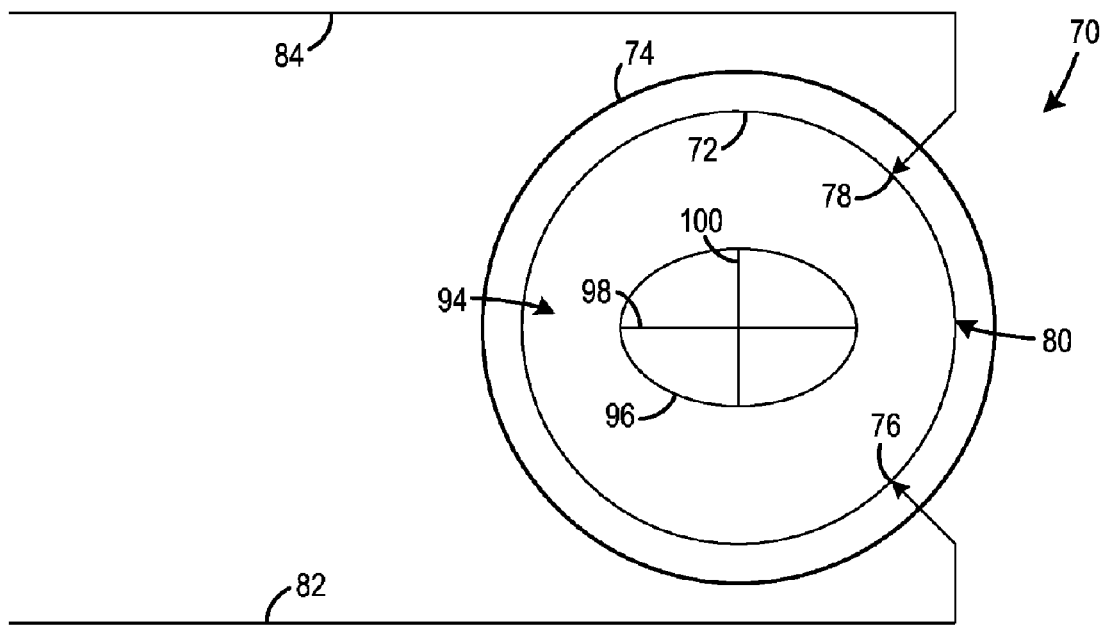
FIG. 2 is a schematic diagram of an RF apparatus according to the present invention.

FIG. 2 shows an RF coil assembly 70 according to one embodiment of the present invention. RF coil assembly 70 includes an end ring 72 and a shield 74. Preferably, RF coil assembly 70 is driven at two drive points, or feed points, 76, 78 around a circumference 80 thereof spaced apart by 90 degrees. In a preferred embodiment, RF coil assembly 70 is a highpass, lowpass, hybrid, or transverse electromagnetic (TEM) birdcage coil; however, other types of birdcage coils are contemplated. Also, RF coil assembly 70 preferably has a circular arrangement; however, an elliptical or other arrangement may be used. With the drive points 76, 78 spaced 90 degrees apart, there is a high level of isolation therebetween. As such, the drive points 76, 78 are treated as two separate and independent drive channels 82, 84. Each channel 82, 84 may be driven at a single drive point 76, 78, respectively, on the circumference 80 of end ring 72 of RF coil assembly 70 as shown in FIG. 2.

Figure 3:
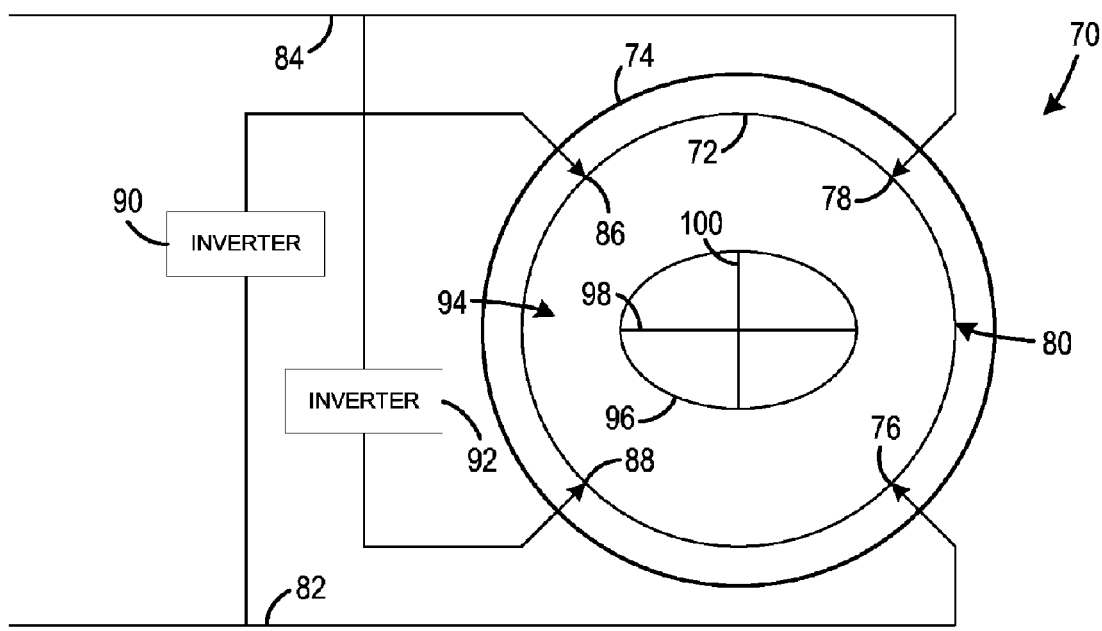
FIG. 3 is a schematic diagram of an RF apparatus according to another aspect of the present invention.

As shown in FIG. 3, however, in another embodiment, channel 82 may be driven at two drive points 76, 86 spaced 180 degrees apart, and channel 84 may be driven at two drive points 78, 88 spaced 180 degrees apart. When channels 82, 84 are each driven using two drive points 76, 86 and 78, 88, respectively, the signals at drive points 76, 86 are in anti-phase to each other, and the signals at drive points 78, 88 are in anti-phase to each other. That is, channel 82 includes a signal inverter 90 such that there is a 180 degree phase difference between signals applied to drive points 76 and 86. Similarly, channel 84 includes a signal inverter 92 such that there is a 180 degree phase difference between signals applied to drive points 78 and 88.

Figure 4:
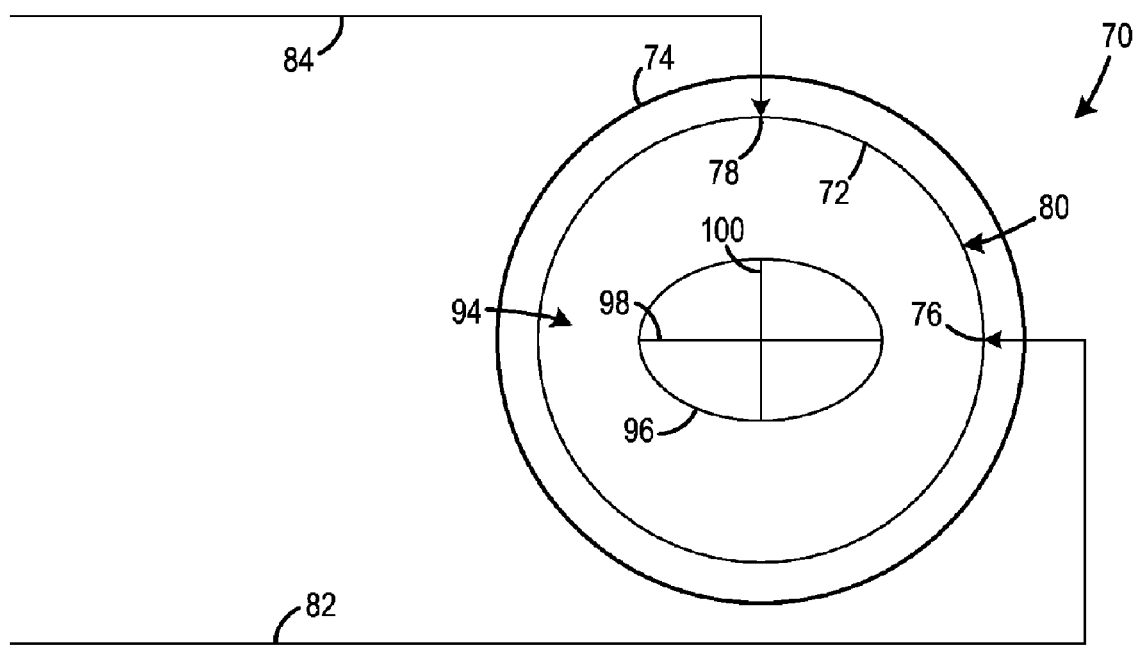
FIG. 4 is a schematic diagram of an RF apparatus according to yet another aspect of the present invention.

Channels 82 and 84 are driven to generate a $B_1$ polarization within a volume-of-interest 94. If drive points 76 and 78 are at +45 degrees and −45 degrees with respect to the horizontal, respectively, then circular polarization can be achieved by driving channels 82, 84 with signals having the same amplitude with a phase shift of 90 degrees therebetween. Horizontal, linear polarization can be achieved with equal amplitude signals and a phase shift of 0 degrees between channels 82, 84. Vertical, linear polarization can be achieved with equal amplitude signals and a phase shift of 180 degrees between channels 82, 84. Alternatively, as shown in FIG. 4, if drive points 76, 78 are at 0 degrees and 90 degrees with respect to the horizontal, respectively, then horizontal, linear polarization can be achieved with a full signal in channel 82 and zero signal in channel 84. Similarly, vertical, linear polarization can be achieved with a full signal in channel 84 and zero signal in channel 82.

By appropriate control of the amplitude and phase of channels 82 and 84 independently, the eccentricity, or degree of elliptical polarization (including linear, elliptical, and circular), is achieved at any given elliptic angle. In this manner, a linearly-, circularly-, or elliptically-shaped $B_1$ polarization field is generated according to a desired eccentricity. To optimize transmit efficiency for an object 96 positioned within the volume-of-interest 94, the degree and orientation of the elliptical $B_1$ polarization field may be acquired, evaluated, and adjusted. Additionally, the degree and orientation of the elliptical $B_1$ polarization field may be calculated with 3D simulations using numerical models. It is contemplated that the eccentricity and orientation of the cross-section of object 96 can be determined using a scout scan, empirical data, or the like. For example, a scout scan may determine a position and length of a major axis 98 and a minor axis 100 of object 96. From the positions and lengths of the major and minor axes, the eccentricity and orientation of the cross-section of object 96 can then be determined and used to help define the orientation and size of the elliptical $B_1$ field.

For a substantially elliptical object 96 positioned within the volume-of-interest 94, the optimal orientation of the elliptical polarization is similar to that of the orientation of the substantially elliptical cross-section of object 96. Hence, if the major axis 98 of the substantially elliptical cross-section of object 96 is horizontal, then a major axis of the elliptical $B_1$ polarization is optimally horizontal. Optimization of the transmit efficiency may be achieved by varying a phase shift between channel 82 and channel 84 while monitoring the ratio of received signal to the square root of the transmit power. Optimization may also be achieved by varying a magnitude of channel 82 and/or channel 84 or by a combination of magnitude and phase shift variation while monitoring the ratio of received signal to the square root of the transmit power.

For example, as shown in FIG. 3, a circular, highpass birdcage RF coil assembly 70 has a first channel 82 and a second channel 84 connected to end ring 72. An elliptically cross-sectioned patient 96 is positioned within the RF coil assembly 70 and has a major axis 98 oriented horizontally. To generate an elliptically polarized $B_1$ field oriented horizontally, the first and second channels 82, 84 are driven at equal amplitude but with a phase shift therebetween of less than 90 degrees. The first and second channels 82, 84 are driven with independent current or voltage controls. If driven with independent current controls, the first and second channels 82, 84 may be driven according to the equations:

$$I_1 = A \cos(2\pi f t),$$

(Eqn. 1), and $$I_2 = B \cos(2\pi f t + \phi),$$

(Eqn. 2), where A and B are the amplitudes for the first and second channels 82, 84, respectively, and $\phi$ is the phase shift between the first and second channels 82, 84.

To improve transmit efficiency, the phase shift is varied while the ratio of received MR signal to a square root of RF transmission power for a given flip angle is monitored. In a preferred embodiment, the given flip angle is much less than 90 degrees. It has been found that for an elliptical cross-section major-minor axes ratio of approximately 2:1 where the major axis is horizontal and for equal signal amplitudes in the first and second channels 82, 84, a phase shift between the first and second channels 82, 84 of approximately 45 degrees provides a desired transmit efficiency. Furthermore, the $B_1$ uniformity is improved.

When an imaging subject 96 such as the human body is positioned within the RF coil assembly 70, various degrees and orientations of elliptical cross-sections may be encountered. Such elliptical cross-sections may range from a substantially elliptical cross-section oriented horizontally to a substantially circular cross-section to a substantially elliptical cross-section oriented vertically. By varying signal amplitudes in the first and second channels 82, 84 and/or the phase shift therebetween, the generation of a $B_1$ polarization field according to various cross-section variations is achieved. For example, when an object having a circular cross-section is positioned within the RF coil assembly 70, a circular $B_1$ polarization field may be generated.

Optimizing the $B_1$ polarization field not only improves transmit efficiency, but it also improves the SNR when receiving signals. Furthermore, a significant reduction in SAR (the amount of power deposited in a subject), e.g. 25%, is advantageously possible. Such improvements and reductions are beneficial and can improve the image uniformity in 1.5 T and 3 T MR imaging systems.

Therefore, in accordance with one embodiment of the invention, an RF apparatus includes an RF coil assembly having a circular coil arrangement and having a pair of independent drive channels connected to the circular coil arrangement. The RF coil assembly is designed to generate a polarized $B_1$ field about a volume-of-interest. An RF coil assembly controller is included that is operationally connected to control input to the pair of independent drive channels to create a substantially elliptical polarized $B_1$ field about a subject having a generally elliptical cross-section disposed within the volume-of-interest.

In accordance with another embodiment of the invention, a method of exciting a volume-of-interest for MR imaging includes positioning an object having an elliptical cross-section in a bore of a magnet. The method also includes determining an alignment of a major axis of the elliptical cross-section and creating an elliptical $B_1$ field in the bore relative to the major axis with a circular RF coil arrangement.

In accordance with yet another embodiment of the invention, an MR imaging apparatus includes a birdcage coil designed to generate a substantially elliptical $B_1$ field about a volume-of-interest. The apparatus also includes a controller to drive the birdcage coil to generate the substantially elliptical $B_1$ field about the volume-of-interest on demand.

The present invention has been described in terms of the preferred embodiment, and it is recognized that equivalents, alternatives, and modifications, aside from those expressly stated, are possible and within the scope of the appending claims.

What is claimed is:

1. An RF apparatus comprising:
an RF coil assembly having a circular coil arrangement and having a pair of independent drive channels connected to the circular coil arrangement, the RF coil assembly designed to generate a polarized $B_1$ field about a volume-of-interest;
an RF coil assembly controller operationally connected to the RF coil assembly to control input to the pair of independent drive channels to create a substantially elliptical polarized $B_1$ field about a subject having a generally elliptical cross-section disposed within the volume-of-interest;
wherein each independent drive channel is configured to receive a respective drive input, and wherein the RF coil assembly controller is further configured to at least one of vary an amplitude of each respective drive input and a phase difference between the respective drive inputs to create the substantially elliptical polarized $B_1$ field;
wherein the RF coil assembly controller is further configured to create a horizontal elliptical polarized $B_1$ field by diverging the pair of independent drive channels with drive inputs of equal signal amplitude and phase shift between the pair of independent drive channels of less than ninety degrees.

2. The RF apparatus of claim 1 wherein the RF coil assembly controller is further configured to drive the pair of independent drive channels such that a phase shift between the pair of independent drive channels is approximately forty-five degrees when a subject having an elliptical cross-section axes ratio of approximately 1:2 is disposed in the volume-of-interest.

3. An RF apparatus comprising:
an RF coil assembly having a circular coil arrangement and having a pair of independent drive channels connected to the circular coil arrangement, the RF coil assembly designed to generate a polarized $B_1$ field about a volume-of-interest;
an RF coil assembly controller operationally connected to the RF coil assembly to control input to the pair of independent drive channels to create a substantially elliptical polarized $B_1$ field about a subject having a generally elliptical cross-section disposed within the volume-of-interest;
wherein each independent drive channel has a pair of feed points in one end ring of the RF coil assembly; and
wherein the RF coil assembly in further configured to drive the pair of feed points of one independent drive channel at −45 degrees and +135 degrees, respectively, and drive the pair of feed points of the other independent drive channel at +45 degrees and −135 degrees, respectively.

4. An RF apparatus comprising:
an RF coil assembly having a circular coil arrangement and having a pair of independent drive channels connected to the circular coil arrangement, the RF coil assembly designed to generate a polarized $B_1$ field about a volume-of-interest;
an RF coil assembly controller operationally connected to the RF coil assembly to control input to the pair of independent drive channels to create a substantially elliptical polarized $B_1$ field about a subject having a generally elliptical cross-section disposed within the volume-of-interest; and
wherein the RF coil assembly controller is further configured to vary a phase shift between the pair of independent drive channels until a ratio of received MR signal strength to a square root of RF transmission power is at a desired value for a given flip angle.

5. An RF apparatus comprising:
a controller configured to determine an eccentricity and an orientation of a cross-section of an object to be imaged;
an RF coil assembly having a circular coil arrangement and having a pair of independent drive channels connected to the circular coil arrangement, the RF coil assembly designed to generate a polarized $B_1$ field relative to the eccentricity and the orientation about a volume-of-interest; and
an RF coil assembly controller operationally connected to the RF coil assembly to control input to the pair of independent drive channels to create a substantially elliptical polarized $B_1$ field about a subject having a generally elliptical cross-section disposed within the volume-of-interest.

6. The RF apparatus of claim 5 wherein the RF coil assembly includes a birdcage coil.

7. The RF apparatus of claim 6 wherein the birdcage coil is one of a highpass, a lowpass, a hybrid, and a TEM birdcage coil.

8. The RF apparatus of claim 5 wherein each independent drive channel is configured to receive a respective drive input, and wherein the RF coil assembly controller is further configured to at least one of vary an amplitude of each respective drive input and a phase difference between the respective drive inputs to create the substantially elliptical polarized $B_1$ field.

9. The RF apparatus of claim 8 wherein the RF coil assembly controller is further configured to create a horizontal elliptical polarized $B_1$ field by diverging the pair of independent drive channels with drive inputs of equal signal amplitude and phase shift between the pair of independent drive channels of less than ninety degrees.

10. The RF apparatus of claim 9 wherein the RF coil assembly controller is further configured to drive the pair of independent drive channels such that a phase shift between the pair of independent drive channels is approximately forty-five degrees when a subject having an elliptical cross-section axes ratio of approximately 1:2 is disposed in the volume-of-interest.

11. The RF apparatus of claim 5 wherein each independent drive channel has a pair of feed points in one end ring of the RF coil assembly.

12. The RF apparatus of claim 11 wherein the RF coil assembly in further configured to drive the pair of feed points of one independent drive channel at −45 degrees and +135 degrees, respectively, and drive the pair of feed points of the other independent drive channel at +45 degrees and −135 degrees, respectively.

13. The RF apparatus of claim 5 wherein the RF coil assembly controller is further configured to vary a phase shift between the pair of independent drive channels until a ratio of received MR signal strength to a square root of RF transmission power is at a desired value for a given flip angle.

14. The RF apparatus of claim 5 wherein the RF coil assembly controller is further configured to control inputs to the pair of independent drive channels to create a substantially circular polarized $B_1$ field when a generally circular cross-section of the subject is disposed within the volume-of-interest.

15. A method of exciting a volume-of-interest for MR imaging, the method comprising the steps of:
   positioning an object having an elliptical cross-section in a bore of a magnet;
   determining an alignment of a major axis of the elliptical cross-section; and
   creating an elliptical $B_1$ field in the bore relative to the major axis with a circular RF coil arrangement.

16. The method of claim 15 further comprising the steps of:
   aligning a major axis of the elliptical $B_1$ field with the major axis of the elliptical cross-section;
   determining a ratio of a received MR signal to a square root of transmit power; and
   varying driving of the circular RF coil arrangement based on the ratio.

17. The method of claim 15 wherein the circular RF coil arrangement is a birdcage coil.

18. The method of claim 15 wherein the step of creating an elliptical $B_1$ field includes the step of varying an amplitude of a pair of drive signals input to the circular RF coil arrangement.

19. The method of claim 15 wherein the step of creating an elliptical $B_1$ field includes the step of maintaining a phase difference between drive channels of the circular RF coil arrangement.

20. The method of claim 15 further comprising:
   acquiring reference data with a scout scan; and
   locating the major axis from the reference data.

21. An MR imaging apparatus comprising:
   a birdcage coil designed to generate a substantially elliptical $B_1$ field about a volume-of-interest; and
   a controller to drive the birdcage coil to generate the substantially elliptical $B_1$ field about the volume-of-interest on demand, wherein the controller is configured to adjust an eccentricity of the substantially elliptical $B_1$ field until a ratio of received MR signal strength to a square root of RF transmission power is at a desired value for a given flip angle.

22. The MR imaging apparatus of claim 21 wherein an orientation of a major axis of the substantially elliptical $B_1$ field substantially matches an orientation of a major axis of an object disposed within the volume-of-interest.

23. The MR imaging apparatus of claim 21 further comprising:
   a first drive channel connected to an end ring of the birdcage coil; and
   a second drive channel connected to the end ring of the birdcage coil, wherein the controller is configured to drive the second drive channel with at least one of an amplitude different than an amplitude of the first drive channel and a phase different than a phase of the first drive channel.

24. The MR imaging apparatus of claim 21 wherein the birdcage coil is one of a circular birdcage coil and an elliptical birdcage coil.

* * * * *